United States Patent [19]

Suganuma

[11] Patent Number: 5,513,388
[45] Date of Patent: Apr. 30, 1996

[54] AUTOMATIC FREQUENCY CONTROL CIRCUIT

[75] Inventor: Gen Suganuma, Mitaka, Japan

[73] Assignee: Japan Radio Co., Ltd., Tokyo, Japan

[21] Appl. No.: 80,407

[22] Filed: Jun. 18, 1993

[30] Foreign Application Priority Data

Jun. 23, 1992 [JP] Japan .................................. 4-187408
Jun. 23, 1992 [JP] Japan .................................. 4-187409
Jun. 23, 1992 [JP] Japan .................................. 4-187410

[51] Int. Cl.$^6$ ........................................................ H04B 1/26
[52] U.S. Cl. .................... 455/258; 455/182.2; 455/192.2; 455/316; 375/344
[58] Field of Search ........................... 455/182.1, 182.2, 455/183.1–183.2, 192.1, 192.2, 192.3, 256, 257, 258, 259, 265, 316, 254, 255; 375/344

[56] References Cited

U.S. PATENT DOCUMENTS

| | | | |
|---|---|---|---|
| 4,727,591 | 2/1988 | Manlove | 455/183.2 |
| 4,932,072 | 6/1990 | Toko | 455/316 |
| 5,107,335 | 4/1992 | Nishiyama et al. | 455/316 |
| 5,107,522 | 4/1992 | Kitayama et al. | 455/256 |
| 5,115,515 | 5/1992 | Yamamoto et al. | 455/265 |
| 5,287,388 | 2/1994 | Oruga et al. | 375/97 |

FOREIGN PATENT DOCUMENTS

| | | |
|---|---|---|
| 0297624 | 1/1989 | European Pat. Off. . |
| 0339647 | 11/1989 | European Pat. Off. . |
| 0412207 | 2/1991 | European Pat. Off. . |
| 2199708 | 7/1988 | United Kingdom . |

*Primary Examiner*—Edward F. Urban
*Assistant Examiner*—Thanh Le
*Attorney, Agent, or Firm*—Loeb and Loeb

[57] ABSTRACT

An automatic frequency control circuit mounted on a mobile station in mobile communication. The automatic frequency control circuit performs feedback control of an oscillation frequency of a local oscillator used in conversion of a reception frequency to an intermediate frequency signal in response to the count result of the frequency of the intermediate frequency signal. If a receiver is not in the hand-off state, counting is performed for comparatively long time; if in the hand-off state, counting is performed for comparatively short time conforming to required stabilization performance at hand off. Occurrence of variations in count values caused by fading is detected, and only the count values worthy of trust are used as a base of control. A level drop caused by fading is compensated by self-oscillation.

12 Claims, 6 Drawing Sheets

AUTOMATIC FREQUENCY CONTROL CIRCUIT

BACKGROUND OF THE INVENTION

1. Field of the Invention

This invention relates to an automatic frequency control (AFC) circuit used at a mobile station for digital communication and more particularly to an AFC circuit which causes the oscillation frequency of an oscillator contained in the mobile station to follow the frequency of a signal received from a base station and stabilizes it.

2. Description of the Related Art

Generally, a receiver of a mobile station adopts a superheterodyne system which requires a local oscillator to convert a reception frequency into an intermediate frequency. As the local oscillator, the configuration can be used which includes a high-precision reference oscillator which oscillates at a high frequency and a circuit which converts an oscillation output of the reference oscillator into a predetermined local oscillation frequency. As the reference oscillator, a voltage-controlled and temperature-compensated crystal oscillator (VC-TCXO) can be used. As the means for converting an oscillation output of the reference oscillator into a local oscillation frequency, a circuit such as a multiplying circuit, or a phase locked loop (PLL) synthesizer can be used.

If the oscillation frequency of the local oscillator, i.e. the local oscillation frequency, contains a deviation, the intermediate frequency signal provided by making frequency conversion of a signal received from the base station shifts from the predetermined frequency. If the frequency of the intermediate frequency signal shifts from the predetermined value, the received data cannot accurately be demodulated and the transmission frequency from the mobile station becomes incorrect.

To prevent such trouble, normally an AFC circuit is used at the mobile station to remove or correct the deviation of the local oscillation frequency.

For example, assume that the receiver has first intermediate frequency $F_{IF1}$ and second intermediate frequency $F_{IF2}$ as intermediate frequencies. Also assume that the control object value of the oscillation frequency of the reference oscillator, i.e. the reference frequency, is $F_0$ and that the first and second local oscillation frequencies provided by performing steps such as multiplying the value are $F_{L1}$ and $F_{L2}$ respectively. When the reference frequency does not shift from the object value $F_0$, the first and second intermediate frequencies provided by frequency conversion, $F_{IF1}$ and $F_{IF2}$, can be represented by the following expressions using the frequency of the reception signal, i.e. the reception frequency $F_R$:

$$F_{IF1} = F_{L1} - F_R$$

$$F_{IF2} = F_{L2} - F_{IF1}$$

$$= F_{L2} - F_{L1} + F_R \quad (1)$$

If the reference frequency contains a deviation, that is, if the reference oscillator oscillates at $F_0(1+\alpha)$, the values of the first and second local oscillation frequencies become $F_{L1}(1+\alpha)$ and $F_{L2}(1+\alpha)$ respectively. As a result, the first and second intermediate frequencies also contain a deviation. Assuming that the first and second intermediate frequencies containing a deviation are represented by $F_{IF1}'$ and $F_{IF2}'$, the frequencies $F_{IF1}'$ and $F_{IF2}'$ are represented as follows:

$$\begin{aligned} F_{IF1}' &= F_{L1}(1+\alpha) - F_R \quad (2) \\ F_{IF2}' &= F_{L2}(1+\alpha) - F_{IF1}' \\ &= F_{L2}(1+\alpha) - F_{L1}(1+\alpha) + F_R \\ &= \alpha(F_{L2} - F_{L1}) + (F_{L2} - F_{L1}) + F_R \end{aligned}$$

By assigning expression (1), expression (2) can be represented as follows:

$$F_{IF1}' = \alpha F_{L1} + F_{IF1}$$

$$F_{IF2}' = \alpha(F_{L2} - F_{L1}) + F_{IF2}$$

$$= \alpha(F_{IF2} - F_R) + F_{IF2} \quad (3)$$

Figure 6:
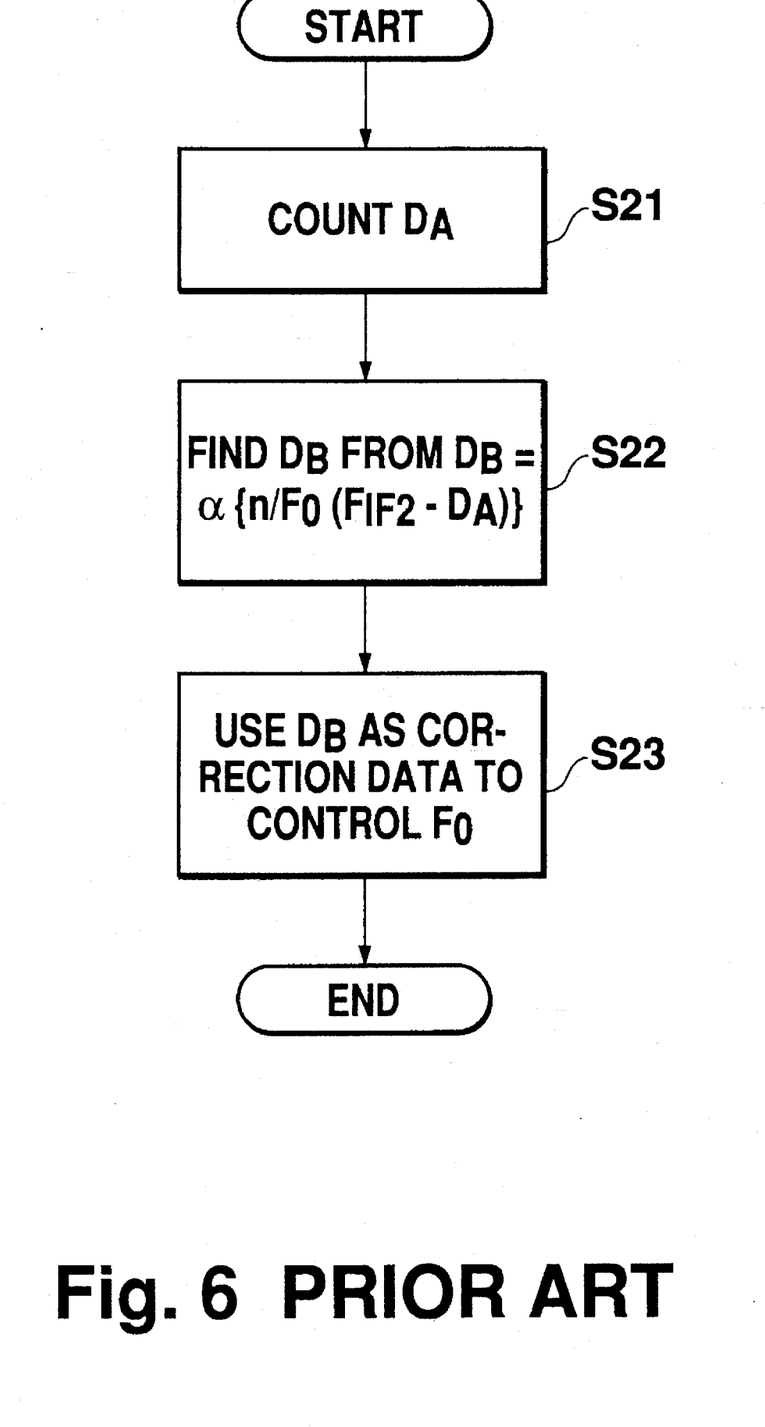
FIG. 6 is a flowchart showing a flow of the conventional AFC operation.

As shown in FIG. 6, at the AFC circuit, the second intermediate frequency generally containing a deviation, $F_{IF2}'$, is counted for gate time $G_T = n/\{F_0(1+\alpha)\}$ where n is an integer, for example, for 100 msec at step S21. The count value $D_A$ is $$\begin{aligned} D_A &= F_{IF2}' \times G_T \quad (4) \\ &= \{\alpha(F_{IF2} - F_R) + F_{IF2}\} \times [n/\{F_0(1+\alpha)\}] \\ &= \{F_{IF2}(1+\alpha) - \alpha F_R\} \times [n/\{F_0(1+\alpha)\}] \\ &= n/F_0 \times F_{IF2} - \alpha F_R n/\{F_0(1+\alpha)\} \end{aligned}$$

In expression (4), c appears only in the second term. Therefore, if the oscillation frequency of the reference oscillator is subjected to feedback control so that the count value $D_A$ becomes the value of the first term $$n/F_0 \times F_{IF2}$$

the reference frequency can be controlled to the object value $F_0$. Based on such relationships, the AFC circuit controls the reference frequency. That is, $$n/F_0 \times F_{IF2} - D_A$$

is multiplied by predetermined coefficient c to find value $D_B$ at step S22, and the value $D_B$ is used as correction data to control the reference frequency $F_0$ at step S23.

Thus, the AFC circuit can stabilize the oscillation frequency of a reference oscillator such as a VC-TCXO.

In such a configuration, however, when the electric field input level is low, if fading occurs, an error occurs in the count value $D_A$, thus it becomes difficult to accurately control the oscillation frequency of the reference oscillator. Even when the electric field input level is high, if a modulation pattern bias or multipath fading occurs, it still becomes difficult to accurately control the oscillation frequency of the reference oscillator.

For example, in the digital cellular communication system under USA specifications, the frequency deviation allowed for a mobile station is a small value of ±200 Hz. In consideration of the fact that the transmission frequency of the base station is an 800 MHz band, it is understood that the frequency deviation tolerance is a strict value of ±0.25 ppm. On the other hand, in the digital cellular communication system under the USA specifications, the reference frequency stablizing time at hand off is short: Within 130 msec at −90 dBm input and within 250 msec at −103 dBm input.

Therefore, if the time for counting the second intermediate frequency generally containing a deviation, $F_{IF2}'$, is set to, for example, 100 msec counting on a margin for the time 130 msec, a frequency error exceeding the specification of ±200 Hz will occur due to fading or any other cause. To eliminate a frequency error caused by fading or modulation pattern bias, the counting time needs only to be prolonged. However, if the time is prolonged, the stabilizing performance at hand off becomes insufficient.

Further, for digital modulation such as π/4 shift QPSK (quadriphase phase shift keying), a modulation pattern needs to be random to suitably perform the control described above, that is, in-band constituents of reception frequencies need to be distributed equally with the center frequency as the center. However, if frequency selective fading such as multipath fading or multifrequency fading occurs, the high or low partial frequency constituent is lost with respect to the center frequency of the reception frequencies. For example, if the reception frequency whose high-frequency constituent is lost is converted into an intermediate frequency which is then counted, the count value $D_A$ becomes a value lower than the center frequency. Generally, the delay time caused by multipath fading is 40 μsec at maximum, thus the fading pitch becomes short (25 kHz) and the frequency deviation standard of ±200 Hz cannot be satisfied.

A count error is caused by a temporary drop in the input level at fading. Since random noise in nature is counted in the period during which the input level drops, a count error occurs. If a reception signal in analog form is supplied to count processing, a count error (malfunction of digital circuit) may occur due to disorder or incompletion of the waveform of the signal.

SUMMARY OF THE INVENTION

Accordingly, it is an object of the invention to enable accurate control of local oscillation frequencies even under circumstances in which an error is prone to occur in count value $D_A$, such as low electric field input level, occurrence of fading, and modulation pattern bias.

It is another object of the invention to ensure frequency stabilizing performance at hand off in addition to accomplishment of the primary object.

To these ends, according to the invention, there is provided an automatic frequency control circuit for use with a receiver which mixes a reception signal with a local oscillation signal to generate an intermediate frequency signal, the automatic frequency control circuit comprising:

(a) means for counting a frequency of the intermediate frequency signal for the predetermined time;

(b) means being responsive to a count value of the counting means for controlling a frequency of the local oscillation signal;

(c) means for determining whether or not an error is prone to occur in the count value; and (d) means being responsive to the determination result of the determining means for executing an error suppression process for suppressing an error of the count value.

According to the invention, there is provided a method of controlling frequencies for use with a receiver which mixes a reception signal with a local oscillation signal to generate an intermediate frequency signal, the method comprising the steps of:

(a) counting a frequency of the intermediate frequency signal for the predetermined time;

(b) controlling a frequency of the local oscillation signal in response to a count value provided by the step of counting;

(c) determining whether or not an error is prone to occur in the count value; and (d) executing an error suppression process for suppressing an error of the count value in response to the determination result provided by the step of determining.

According to the invention, there is provided a mobile station comprising:

(a) means for receiving a signal from a base station;

(b) means for generating a local oscillation signal having a predetermined local oscillation frequency;

(c) means for mixing the signal received from the base station with the local oscillation signal for generating an intermediate frequency signal; and (d) automatic frequency control circuit of the invention.

In the invention, first, a frequency of an intermediate frequency signal is counted for the predetermined time, and the local oscillator signal frequency is controlled in response to the count value. At the time, whether or not an error is prone to occur in the count value is determined. In response to the result, an error suppression process is executed. The error suppression process is to suppress an error when it is prone to occur in the count value. Therefore, even if the electric field input level drops, fading occurs, or a modulation pattern deviation occurs, the invention is capable of reacting to them for accurate frequency control.

First, the error suppression process is embodied by the process of prolonging the count time if the electric field input level to the receiver is low. The electric field input level which is low can be overcome by executing the process. Second, the process is embodied by the process of shortening the count time if the receiver is in the hand-off state. This process can be executed when high-speed frequency stabilization is required. Third, the error suppression process is embodied by the following process; if the receiver is not in the hand-off state, the count time is set comparatively long; if the receiver is in the hand-off state, the count time is set in response to the specification of the time required to stabilize the frequency of the local oscillation signal at hand off within the control object range and in response to the detected electric field input level. This process is significant to the situation that the high-speed frequency stabilization is required and the electric field input level becomes low. By this process, both of these problems can be overcome.

Fourth, the error suppression process is embodied by following process: the variations in the count values are observed in a time series manner, and if the variations obtained by the observation are comparatively large, the count values are handled as invalid values and are excluded from the control base of the local oscillation frequency. Therefore, the missing of the high frequency constituent, caused by a modulation pattern deviation, fading, etc., can be overcome by executing the process. Fifth, the error suppression process is realized as follows, for example: the variations in the count values are observed in a time series manner, and if the variations obtained by the observation are comparatively small, the observed count values comparatively distant from a predetermined center value are excluded from the control base of the local oscillation frequency. Thus, only the count values near the center value and comparatively worthy of trust can be used for frequency control. Sixth, the error suppression process is embodied as follows: the variations in the count values are observed in a time series manner, and if the variations obtained by observation are comparatively large, the count values are handled as invalid values and are excluded from the control base of the local oscillation frequency; if comparatively small, the observed count values comparatively distant from a predetermined center value are excluded from the control base of the local oscillation frequency. Thus, the missing of the high frequency constituent, caused by a modulation pattern deviation, fading, etc., can be overcome, and only the count values near the center value and comparatively worthy of trust can be used for frequency control.

Seventh, the error suppression process is embodied by the process using hysteresis comparison, square wave generation, and self-oscillation. The level of an intermediate frequency signal is compared with a threshold having a hysteresis characteristics for shaping the intermediate frequency signal to a square wave, and a signal indicating the timing of the obtained square wave is supplied to count processing. At the time, the threshold values are set so that they are crossed when the intermediate frequency signal has a sufficient amplitude. If the level of the intermediate frequency signal drops due to the effect of fading, etc., a signal having a frequency substantially equal to the control object value of the intermediate frequency signal is supplied to count processing. Then, even if the level temporarily drops due to fading, random noise in nature is not counted, thus more accurate counting, in its turn, frequency control can be performed.

The local oscillation signal generation means may be made up of a reference oscillator which oscillates at a predetermined reference frequency and a local oscillator which converts a frequency of an output signal of the reference oscillator into a lower frequency for generating a local oscillation signal. The number of local oscillation frequencies may conform to the number of intermediate frequencies. An output of the reference oscillator may also be used for generation of a transmission frequency.

DESCRIPTION OF THE PREFERRED EMBODIMENTS

Referring now to the accompanying drawings, there are shown preferred embodiments of the invention.

Figure 1:
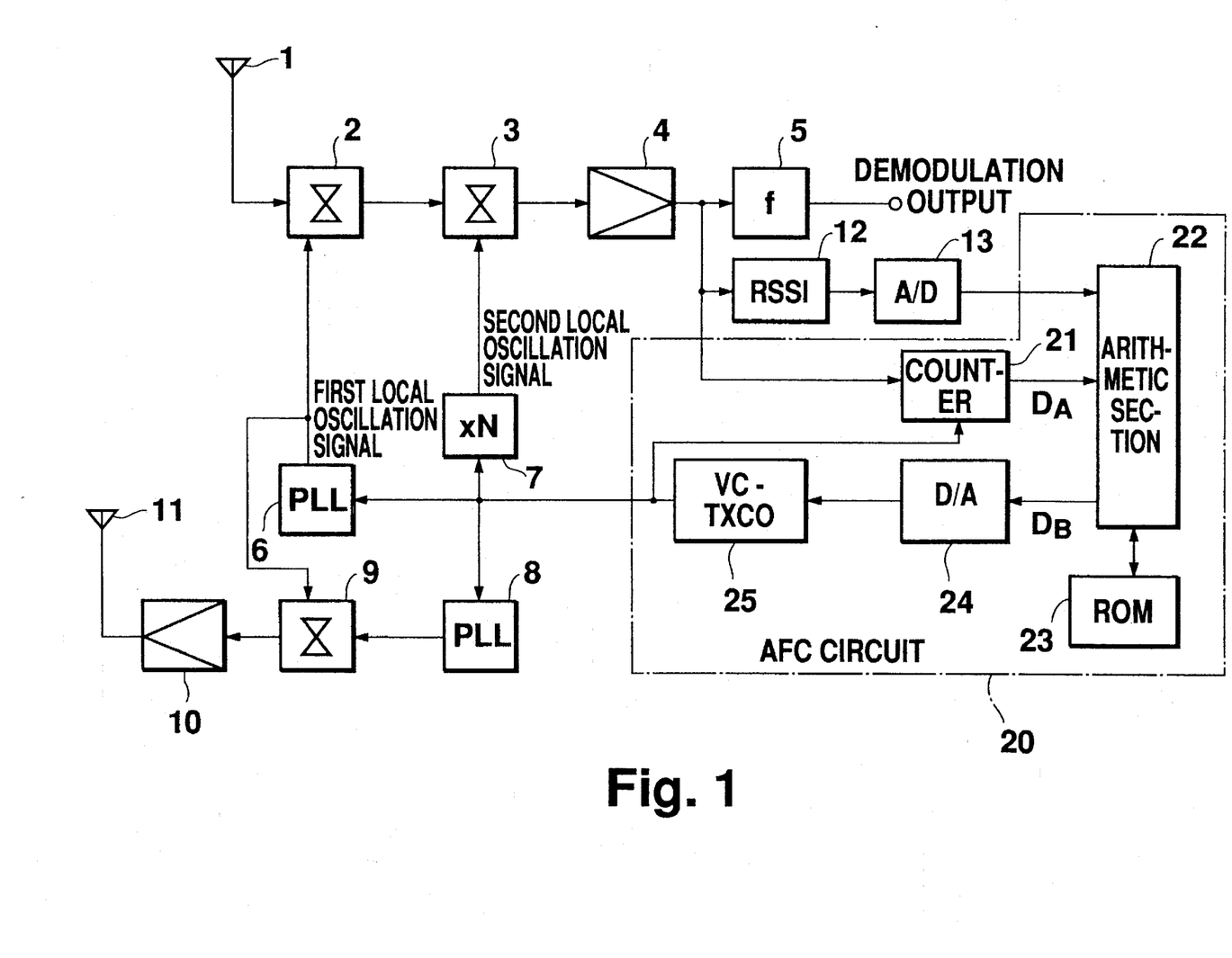
FIG. 1 is a block diagram showing the configuration of a mobile station according to first and second embodiments of the invention.

FIG. 1 shows the configuration of a mobile station according to one embodiment of the invention. The circuitry shown in FIG. 1 comprises a receiver of a superheterodyne system, a transmitter which transmits signals to a base station, and an AFC circuit for stabilizing local oscillation frequencies at the receiver and transmitter.

First, the receiver comprises a reception antenna 1, mixers 2 and 3, an amplifier 4, a code determination circuit 5, a PLL synthesizer 6, and a multiplying-by-N circuit 7.

The reception antenna 1 is an antenna for receiving signals transmitted from the base station. The mixer 2 mixes a received signal with the first local oscillation signal having the first local oscillation frequency $F_{L1}$, thereby converting the received signal from the reception frequency from the base station, $F_R$, into the first intermediate frequency $F_{IF1}$. The mixer 3 mixes the received signal converted into the first intermediate frequency $F_{IF1}$ with the second local oscillation signal having the second local oscillation frequency $F_{L2}$, thereby converting the received signal from the first intermediate frequency $F_{IF1}$ into the second intermediate frequency $F_{IF2}$. The amplifier 4 amplifies the signal of the second intermediate frequency $F_{IF2}$ provided by the mixer 3 and sends the resultant signal to the code determination circuit 5. The code determination circuit 5 performs the determinition of the code transmitted from the base station based on the amplified signal, and sends the determination result to a circuit at the following stage (not shown) as demodulation output.

The PLL synthesizer 6 makes up a first local oscillator in cooperation with a VC-TCXO 25 contained in the AFC circuit. That is, the PLL synthesizer 6 synchronizes in phase with reference frequency $F_0$ output from the VC-TCXO 25 for generating the first local oscillation signal having the first local oscillation frequency $F_{L1}$. Also, the multiplying-by-N circuit 7 makes up a second local oscillator in cooperation with the VC-TCXO. That is, the multiplying-by-N circuit 7 multiplies by N the period of the signal of the reference frequency $F_0$ output from the VC-TCXO 25, thereby generating the second local oscillation signal having the second local oscillation frequency $F_{L2}$.

FIG. 1 also shows the transmitter comprising a PLL synthesizer 8, a mixer 9, an amplifier 10, and a transmission antenna 11. The PLL synthesizer 8 synchronizes in phase with an output of the VC-TCXO 25 for generating an intermediate frequency signal for transmission having an intermediate frequency for transmission $F_{IFT}$. The mixer 9 mixes the intermediate frequency signal for transmission with the first local oscillation signal, thereby generating a transmission signal having a transmission frequency $F_T$. The amplifier 10 amplifies the transmission signal. The transmission antenna 11 is an antenna for transmitting the amplified transmission signal to the base station, etc.

FIG. 1 further shows a received signal strength indicator (RSSI) circuit 12, an analog-to-digital (A/D) converter 13, and the AFC circuit 20.

The RSSI circuit 12 monitors an output of the amplifier 4 and generates a DC voltage showing the electric field input level to the reception antenna 1, then sends the voltage to the A/D converter. The A/D converter converts the received DC voltage into digital data and sends the resultant digital data to an arithmetic section 22 of the AFC circuit 20. The arithmetic section 22 transmits the received digital data to the base station and uses it for AFC control as described below.

The AFC circuit 20 is composed of a counter 21, the arithmetic section 22, a ROM 23, a digital-to-analog (D/A) converter, and the VC-TCXO 25. The counter 21 counts the frequency of the second intermediate frequency signal, namely, the second intermediate frequency generally containing a deviation, $F_{IF2}'$, for the gate time $G_T$. The arithmetic section 22 reads the count result $D_A$ and performs predetermined processing described below. The ROM 23 is a memory which stores programs and coefficient values required for processing at the arithmetic section 22. The D/A converter 24 converts correction data $D_B$ output from the arithmetic section 22 into an analog signal. The oscillation frequency of the VC-TCXO 25 is corrected in response to the analog signal output from the D/A converter 24. In the embodiment, the AFC circuit 20 applies feedback control of the oscillation frequency of the VC-TCXO 25. Since a single reference generator, namely the VC-TCXO 25 is used, the circuit configuration is simplified. Since the output of the VC-TCXO 25 is used for generation of not only first and second local oscillation frequencies $F_{L1}$ and $F_{L2}$, but also intermediate frequency for transmission $F_{IFT}$, the transmission frequency $F_T$ is also made accurate by the operation of the AFC circuit.

Figure 2:
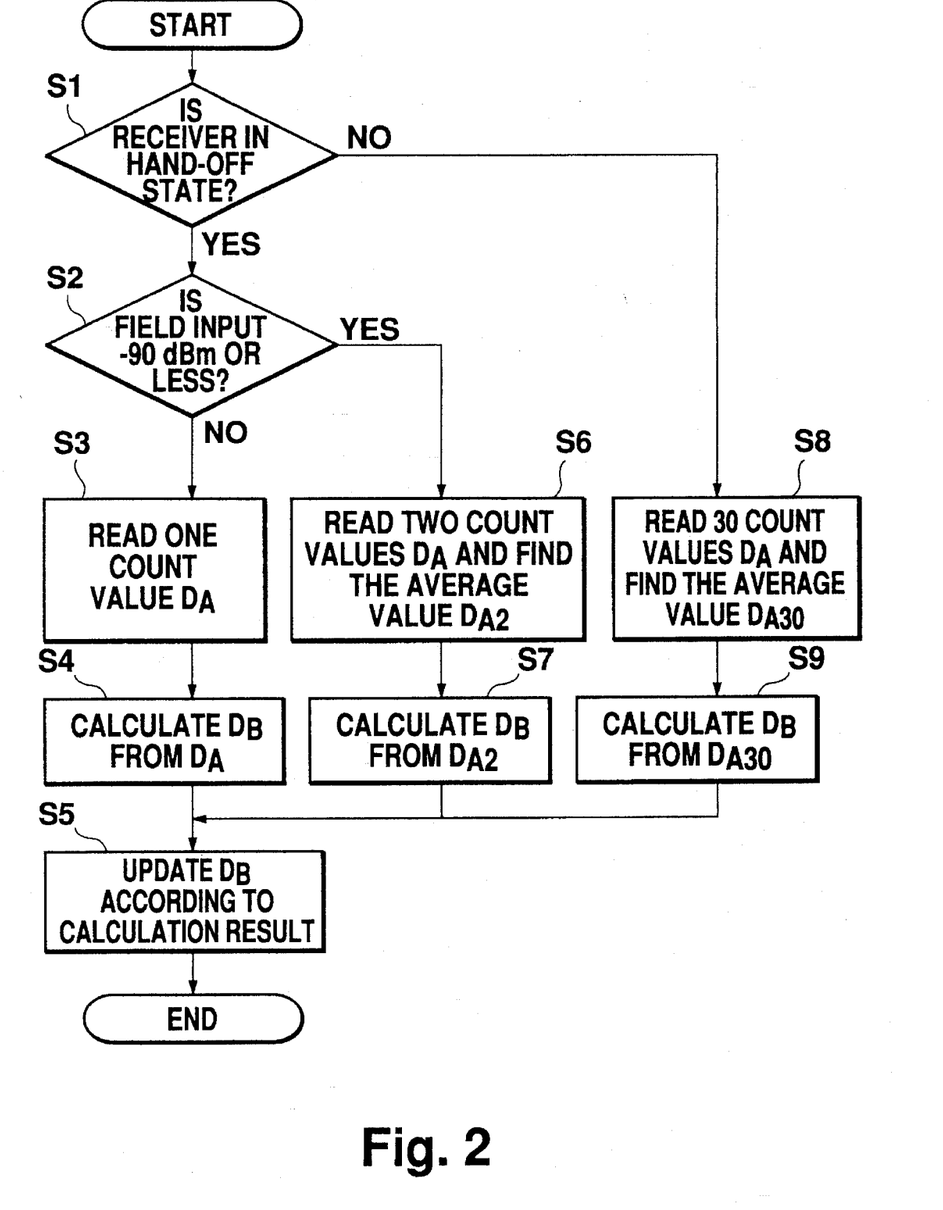
FIG. 2 is a flowchart showing an operation flow of an arithmetic section of the mobile station according to the first embodiment of the invention.

FIG. 2 shows an operation flow of the arithmetic section 22 of the mobile station according to the first embodiment of the invention.

As shown in the flowchart, first at step S1, the arithmetic section 22 determines whether or not the receiver is in the hand-off state at present. That is, it determines whether or not the receiver in FIG. 1 moves from one radio zone (cell) to another and radio line connection is being transferred between the radio zones (cells). If the receiver is not in the hand-off state, the arithmetic section 22 executes steps S8, S9, and S5 in order.

At step S8, the average value of count values $D_A$ provided by the counter 21 is found. For example, the time average value $D_{A30}$ of 30 count values $D_A$ is calculated. Assuming that it takes 100 msec to provide one count value $D_A$, it takes 3 sec to provide 30 count values $D_A$. Therefore, the average value $D_{A30}$ is the average value for 3 sec.

Thus, if for example, an average for 3 sec is taken, the effects of a modulation pattern and fading can be eliminated. Although suitable execution of the method described in Description of the Related Art without any error requires that the electric field input level should be sufficiently high, that the modulation pattern should be random, and that no fading should occur, such premises are not required in the embodiment. Even if the electric field input level is low, the modulation pattern is not random, and fading occurs, the embodiment finds the average value for comparatively long time, thereby suppressing errors caused by the factors and finding the accurate center value of the second intermediate frequency $F_{IF2}'$.

At step S9, the arithmetic section 22 performs an operation of correction data $D_B$ in response to the average value $D_{A30}$. The operation method may be the same as the method described in Description of the Related Art. At step S5, the correction data $D_B$ found at step S9 is output to the D/A converter 24. Thus, the oscillation frequency of the VC-TCXO 25 is subjected to feedback control.

On the other hand, if the receiver is judged to be in the hand-off state at step S1, then at step S2 the arithmetic section 22 determines whether or not the electric field input level detected by the RSSI circuit 12 and converted into digital data by the A/D converter 13 is a predetermined value or less. Preferably, −90 dBm should be used as the threshold value for determination in the digital cellular communication system of USA specifications, but the invention is not limited to that threshold value.

If the input level is judged to be more than −90 dBm, then the arithmetic section 22 executes steps S3 to S5; if it is judged to be −90 dBm or less, then the arithmetic section 22 executes steps S6, S7, and S5. Both steps S3 and S6 are input steps of count value $D_A$; at the former step, an average operation on the count value $D_A$ is not performed; whereas at the latter step, an average operation on two count values $D_A$ is performed. Both steps S4 and S7 are operation steps of correction data $D_B$; at the former step, as its base, one count value $D_A$ is used; while at the latter step, the average value $D_{A2}$ found at step S6 is used.

In the other words, the total count time is selected in response to the electric field input level to meet the specification requirement for the VC-TCXO 25 stabilizing time at hand off. This means that in the digital cellular communication system of USA specifications, if the electric field input level is −90 dBm at hand off, the VC-TCXO 25 oscillation frequency must be stabilized within the object range within 130 msec; if it is −103 dBm, the VC-TCXO 25 oscillation frequency must be stabilized within the object range within 250 msec. In FIG. 2, the total count time, when the electric field input level is −90 dBm, is set to 200 msec which is a value near 250 msec.

According to the embodiment, the total count time is changed in response to the stabilization time required at hand off, thereby suppressing an error caused by a modulation pattern or fading and performing accurate reference frequency control even if the electric field input level is low, thus the S/N ratio is low. When the electric field input level is high, the reference frequency can be controlled quickly.

Figure 3:
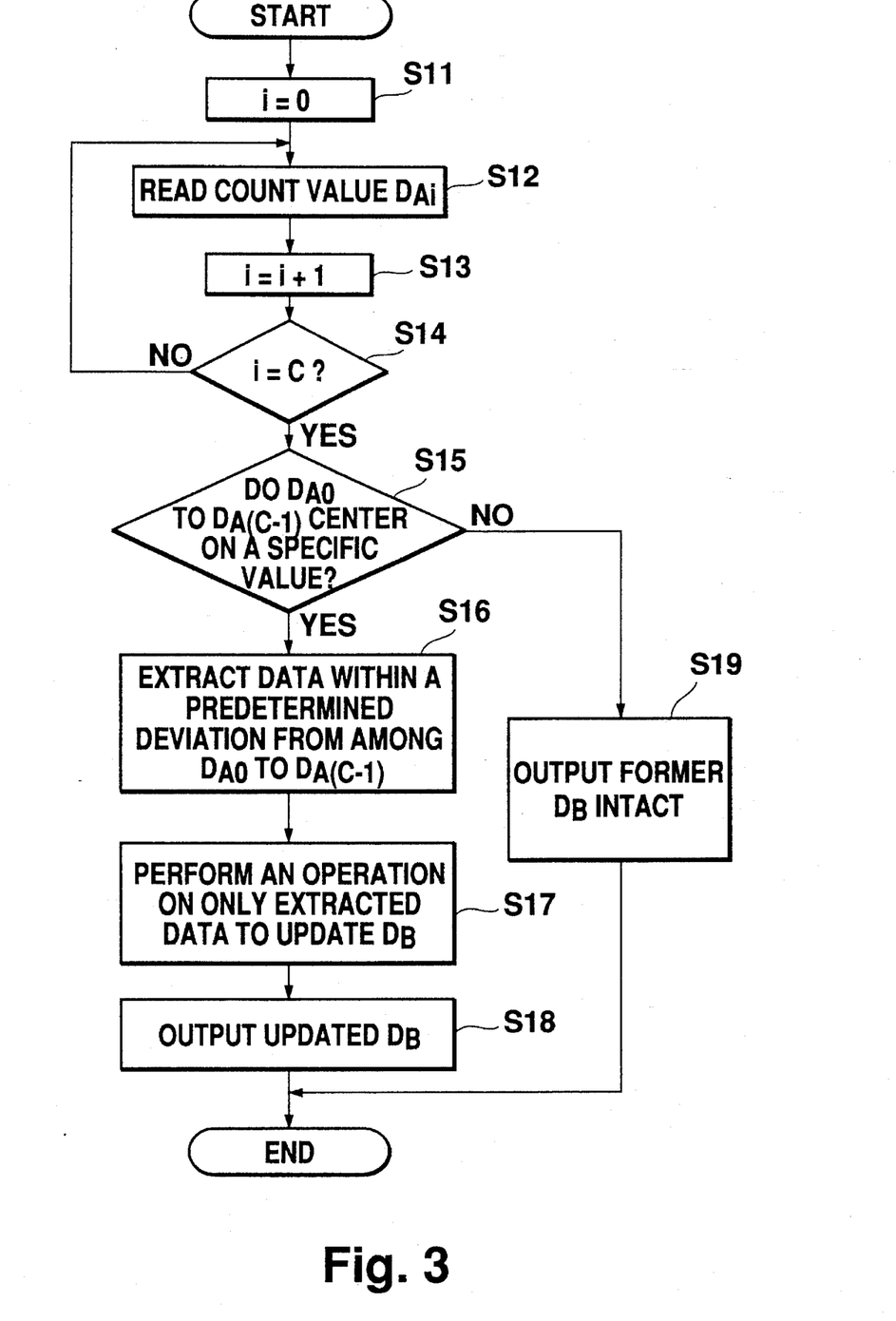
FIG. 3 is a flowchart showing an operation flow of an arithmetic section according to a second embodiment of the invention.

FIG. 3 shows an operation flow of an arithmetic section according to a second embodiment of the invention. The second embodiment has the same circuit configuration as the configuration in FIG. 1, thus circuit parts identical with or similar to those previously described above in FIG. 1 and steps identical with or similar to those previously described in the first embodiments shown in FIG. 2 are denoted by the same reference numerals here.

In the second embodiment, the count time of counter 21 is set to a comparatively small value. That is, the time resulting from dividing the former gate time described in Description of the Related Art into C equal parts (C: an integer of 2 or greater) is set as the gate time of the counter 21. The arithmetic section 22 reads C count values of the counter 21 consecutively at steps S11 to S14, namely, reads ith count value $D_{Ai}$ while incrementing i by one from 0 to C-1.

At step S15, the arithmetic section 22 determines whether or not the read count values $D_{A0}$ to $D_{A(C-1)}$ center on a specific value (center value d), namely, evaluates how many pieces of the count values $D_{A0}$ to $D_{A(C-1)}$ distribute around the center value d (concentration degree). If the concentration degree is judged to be sufficiently high as a result of the evaluation, the arithmetic section 22 extracts only data of the count values $D_{A0}$ to $D_{A(C-1)}$ within a predetermined deviation from the center value d at step S16, uses only the extracted count values to generate correction data $D_B$ at step S17, and outputs the generated correction value $D_B$ to D/A converter 24 at step S18. If the concentration degree is judged to be low as a result of the evaluation at step S15, the arithmetic section 22 does not update correction data $D_B$ and outputs it intact to the D/A converter 24 at step S19.

Thus, in the embodiment, even if a factor such as a multipath fading causes a large error to occur in the count value, the count value containing the error is not used for reference frequency control, thereby accurately controlling the reference frequency without the effect of multipath fading, etc.

The sequences in FIGS. 2 and 3 can be combined.

Figure 4:
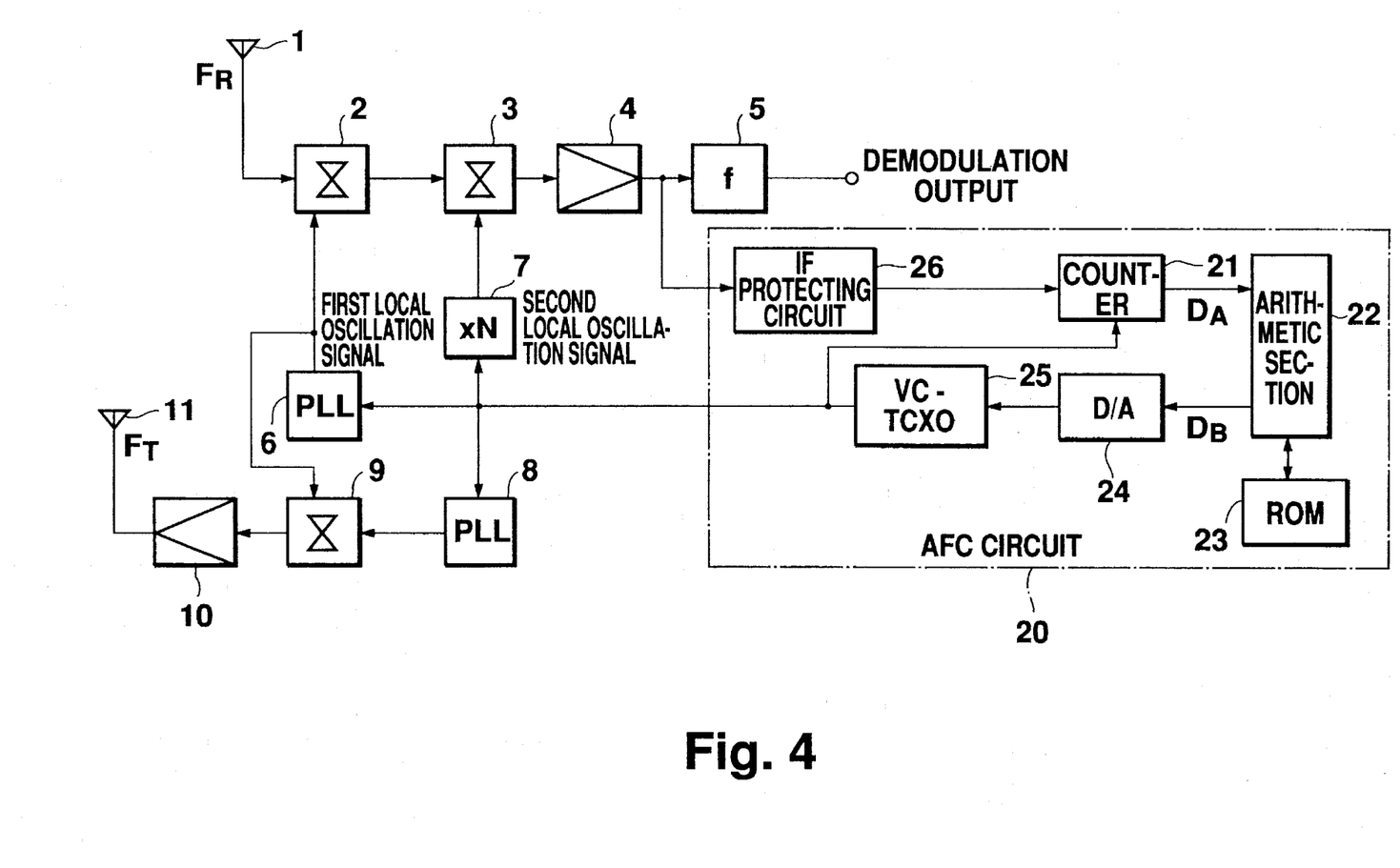
FIG. 4 is a block diagram showing the configuration of a mobile station according to a third embodiment of the invention.

FIG. 4 shows the configuration of a mobile station according to a third embodiment of the invention. The mobile station according to the third embodiment is newly provided with an IF protecting circuit 26. The RSSI circuit 12 and A/D converter 13 in FIG. 1 are omitted for simplicity of FIG. 4. Circuit parts identical with or similar to those previously described with reference to FIG. 1 are denoted by the same reference numerals in FIG. 4 and will therefore not be discussed again.

The IF protecting circuit has a comparison function having a hysteresis characteristic and a self-oscillating function at a predetermined second intermediate frequency $F_{IF2}$. Although FIG. 4 does not show the internal configuration of the IF protecting circuit 26, those skilled in the art would be able to configure the IF protecting circuit by using parts such as a hysteresis comparator, a pulse generator, and a logic circuit, based on the description that follows.

Figure 5:
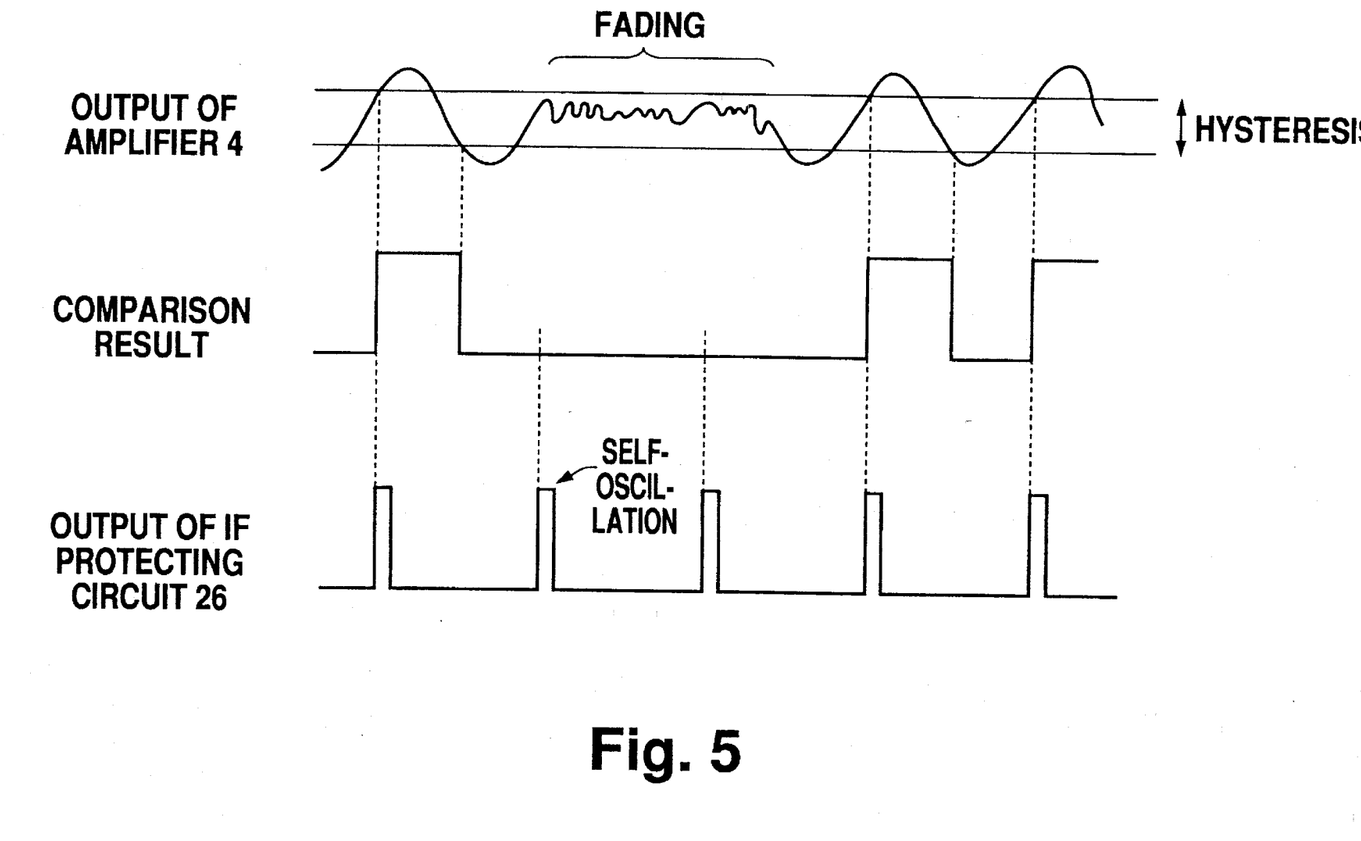
FIG. 5 is a timing chart showing the operation of an IF protecting circuit of the mobile station according to the third embodiment of the invention.

The IF protecting circuit 26 is a circuit provided to enable the reference frequency $F_0$ to be controlled accurately even if fading occurs where the reception signal level temporarily drops. FIG. 5 shows the function and operation of the IF protecting circuit 26.

The IF protecting circuit 26 compares an output of amplifier 4 with a predetermined threshold value. At the time, the comparison function of the IF protecting circuit 26 has a hysteresis characteristic. Therefore, the threshold value with which the output of the amplifier 4 is to be compared in the period during which the output of the amplifier 4 is increasing differs from that in the period during which the output is decreasing. In more detail, the threshold value in the period during which the output of the amplifier 4 is increasing is comparatively high; that in the period during which the output is decreasing is comparatively low, as shown in FIG. 5. These two types of threshold values are set so that they are crossed by the output of the amplifier 4 so long as the output of the amplifier 4 has some degree of amplitude.

Obtained as a result of the comparison is a square wave signal as shown in the intermediate stage of FIG. 5. This means that a signal whose waveform is shaped to a square wave is provided by the IF protecting circuit 26 which performs the hysteresis comparison.

While executing the comparison, the IF protecting circuit 26 self-oscillates a pulse at a frequency substantially equal to the second intermediate frequency $F_{IF2}$, and then outputs the oscillated pulse to counter 21 in synchronization with the rising edge of a square wave signal resulting from the comparison. The counter 21 counts pulses output from the IF protecting circuit 26, thereby detecting the second intermediate frequency $F_{IF2}$ suitably.

When a reception signal is affected by fading, the output amplitude of the amplifier 4 may temporarily drop as shown in FIG. 5. In this case, the output of the amplifier 4 does not cross threshold values, thus no square wave signal is obtained even if a hysteresis comparison is made. Then, the IF protecting circuit outputs self-oscillated pulses to the counter 21. As described above, the self-oscillation frequency is substantially equal to the second intermediate frequency $F_{IF2}$. Therefore, even if the output amplitude of the amplifier 4 temporarily drops due to the effect of fading, randomness of the fading waveform (randomness of natural noise) does not adversely affect the count result of the counter 21. The IF protecting circuit 26 detects occurrence of a temporary drop in the output amplitude of the amplifier 4 when the elapsed time since the instance of the previous change of the result value of hysteresis comparison exceeds the predetermined time. Those skilled in the art will be able to implement the function by using a timer, etc.

The self-oscillation output function of the IF protecting circuit 26 provides an advantage of being able to control the VC-TCXO 25 oscillation frequency more accurately as a result. Since the hardware configuration of the IF protecting circuit 26 may be very simple, the configuration and scale of the mobile station may be comparatively simple and small. Further, the IF protecting circuit 26 shapes an output of the amplifier 4 to a square wave. This means that a waveform appropriate for the following digital circuitry containing the counter 21 is provided by the IF protecting circuit 26. This suppresses a malfunction of the digital circuitry.

The operation sequences in the first and second embodiments can also be executed in the third embodiment.

What is claimed is:

1. For use with a receiver which mixes a reception signal with a local oscillation signal to generate an intermediate frequency signal, an automatic frequency control circuit comprising:

means for counting a frequency of the intermediate frequency signal for a predetermined time;

means being responsive to a count value by the counting means for controlling a frequency of the local oscillation signal;

determination means for determining whether or not an error is prone to occur in the count value;

means being responsive to a determination result by the determining means for executing an error suppression process for suppressing the error of the count value, wherein said determination means has means for detecting the receiver being in a hand-off state;

said error suppression process execution means has means for setting said count time comparatively long if the receiver is not in the hand-off state;

said determination means further includes means for detecting an electric field input level to the receiver if the receiver is in the hand-off state; and said error suppression process execution means further includes means for setting said count time in response to a specification of time required to stabilize the frequency of the local oscillation signal at hand off within a control object range and in response to the detected electric field input level.

2. The automatic frequency control circuit as claimed in claim 1, wherein said error suppression process execution means has means for shortening said count time if the receiver is in the hand-off state.

3. The automatic frequency control circuit as claimed in claim 1, wherein said determination means includes:

means for observing variations in said count values in a time series manner; and means for determining whether or not the variations obtained by observation are comparatively large; and said error suppression process execution means has means for handling said count values as invalid values and excluding them from a base of control of local oscillation frequency if the variations are comparatively large.

4. For use with a receiver which mixes a reception signal with a local oscillation signal to generate an intermediate frequency signal, an automatic frequency control circuit comprising:

means for counting a frequency of the intermediate frequency signal for a predetermined time;

means being responsive to a count value by the counting means for controlling a frequency of the local oscillation signal;

determination means for determining whether or not an error is prone to occur in the count value; and means being responsive to a determination result by the determining means for executing an error suppression process for suppressing the error of the count value, wherein said determination means includes:

means for observing variations in said count values in a time series manner; and means for determining whether or not the variations obtained by observation are comparatively small; and said error suppression process execution means has means for excluding the observed count values comparatively distant from a predetermined center value from a base of control of local oscillation frequency if the variations are comparatively small.

5. For use with a receiver which mixes a reception signal with a local oscillation signal to generate an intermediate frequency signal, an automatic frequency control circuit comprising:

means for counting a frequency of the intermediate frequency signal for a predetermined time;

means being responsive to a count value by the counting means for controlling a frequency of the local oscillation signal;

determination means for determining whether or not an error is prone to occur in the count value; and means being responsive to a determination result by the determining means for executing an error suppression process for suppressing the error of the count value, wherein said determination means includes:

means for observing variations in said count values in a time series manner; and means for determining whether or not the variations obtained by observation are comparatively small; and said error suppression process execution means includes:

means for handling said count values as invalid values and excluding them from a base of control of local oscillation frequency if the variations are comparatively large; and means for excluding the observed count values comparatively distant from a predetermined center value from the base of control of local oscillation frequency if the variations are comparatively small.

6. For use with a receiver which mixes a reception signal with a local oscillation signal to generate an intermediate frequency signal, an automatic frequency control circuit comprising:

means for counting a frequency of the intermediate frequency signal for a predetermined time;

means being responsive to a count value by the counting means for controlling a frequency of the local oscillation signal;

determination means for determining whether or not an error is prone to occur in the count value; and means being responsive to a determination result by the determining means for executing an error suppression process for suppressing the error of the count value, wherein said determination means has means for comparing a level of the intermediate frequency signal with threshold values having a hysteresis characteristic for generating a square wave when the intermediate frequency signal crosses the threshold values; said threshold values being set so as to be crossed if the intermediate frequency signal has a sufficient amplitude; and said error suppression process execution means include:

means for supplying a signal indicating a timing of the square wave signal to said count means as an object of the counting when the square wave is generated; and means for supplying a signal having a frequency substantially equal to a control target value of the intermediate frequency signal to said count means as an object of counting when the square wave is not generated.

7. For use with a receiver which mixes a reception signal with a local oscillation signal to generate an intermediate frequency signal, a method of controlling frequencies comprising the steps of:

counting a frequency of the intermediate frequency signal for a predetermined time;

controlling a frequency of the local oscillation signal in response to a count value provided by the step of counting;

determining whether or not an error is prone to occur in the count value; and executing an error suppression process for suppressing the error of the count value in response to a determination result provided by the step of determining, wherein said determining step includes detecting the receiver being in a hand-off state;

said error suppression step includes setting said count time comparatively long if the receiver is not in the hand-off state;

said determining step further includes the step of detecting an electric field input level to the receiver if the receiver is in the hand-off state; and said error suppression step further includes the step of setting said count time in response to a specification of time required to stabilize the frequency of the local oscillation signal at hand off within a control object range and in response to the detected electric field input level.

8. The method as claimed in claim 7, wherein said error suppression step includes shortening said count time if the receiver is in the hand-off state.

9. The method as claimed in claim 7, wherein said monitoring determination step includes:

observing variations in said count values in a time series manner; and determining whether or not the variations obtained by observation are comparatively large; and said error suppression step includes handling said count values as invalid values and excluding them from a base of control of local oscillation frequency if the variations are comparatively large.

10. For use with a receiver which mixes a reception signal with a local oscillation signal to generate an intermediate frequency signal, a method of controlling frequencies comprising the steps of:

counting a frequency of the intermediate frequency signal for a predetermined time;

controlling a frequency of the local oscillation signal in response to a count value provided by the step of counting;

determining whether or not an error is prone to occur in the count value; and executing an error suppression process for suppressing the error of the count value in response to a determination result provided by the step of determining, wherein said determining step includes:

observing variations in said count values in a time series manner; and determining whether or not the variations obtained by observation are comparatively small; and said error suppression step includes excluding the observed count values comparatively distant form a predetermined center value from a base of control of local oscillation frequency if the variations are comparatively small.

11. For use with a receiver which mixes a reception signal with a local oscillation signal to generate an intermediate frequency signal, a method of controlling frequencies comprising the steps of:

counting a frequency of the intermediate frequency signal for a predetermined time;

controlling a frequency of the local oscillation signal in response to a count value provided by the step of counting;

determining whether or not an error is prone to occur in the count value; and executing an error suppression process for suppressing the error of the count value in response to a determination result provided by the step of determining, wherein said determining step includes:

observing variations in said count values in a time series manner; and determining whether or not the variations obtained by observation are comparatively small; and said error suppression step includes:

handling said count values as invalid values and excluding them from a base of control of local oscillation frequency if the variations are comparatively large; and excluding the observed count values comparatively distant from a predetermined center value from the base of control of local oscillation frequency if the variations are comparatively small.

12. For use with a receiver which mixes a reception signal with a local oscillation signal to generate an intermediate frequency signal, a method of controlling frequencies comprising the steps of:

counting a frequency of the intermediate frequency signal for a predetermined time;

controlling a frequency of the local oscillation signal in response to a count value provided by the step of counting;

determining whether or not an error is prone to occur in the count value; and executing an error suppression process for suppressing the error of the count value in response to a determination result provided by the step of determining, wherein said determining step includes comparing a level of the intermediate frequency signal with threshold values having a hysteresis characteristic for generating a square wave when the intermediate frequency signal crosses the threshold values; said threshold values being set so as to be crossed if the intermediate frequency signal has a sufficient amplitude; and said error suppression step includes:

when the square wave is generated as a result of the comparison, supplying a signal indicating a timing of the square wave signal to said count means as an object of counting; and when the square wave is not generated as a result of the comparison, supplying a signal having a frequency substantially equal to a control target value of the intermediate frequency signal to said count means as an object of counting.

* * * * *